(12) United States Patent
Lin et al.

(10) Patent No.: US 12,328,856 B2
(45) Date of Patent: Jun. 10, 2025

(54) COMPONENT SHIELDING

(71) Applicant: Google LLC, Mountain View, CA (US)

(72) Inventors: Wen Shian Lin, New Taipei (TW);
Chien Hua Hsu, New Taipei (TW);
Shihwen Lee, New Taipei (TW);
Bing-Feng Wang, New Taipei (TW);
Chijer Wang, Taipei (TW)

(73) Assignee: Google LLC, Mountain View, CA (US)

( * ) Notice: Subject to any disclaimer, the term of this patent is extended or adjusted under 35 U.S.C. 154(b) by 254 days.

(21) Appl. No.: 17/937,953

(22) Filed: Oct. 4, 2022

(65) Prior Publication Data

US 2024/0114670 A1    Apr. 4, 2024

Related U.S. Application Data

(60) Provisional application No. 63/378,189, filed on Oct. 3, 2022.

(51) Int. Cl.
H05K 5/00    (2025.01)
H05K 9/00    (2006.01)

(52) U.S. Cl.
CPC ......... *H05K 9/0028* (2013.01); *H05K 9/0032* (2013.01); *H05K 9/0037* (2013.01)

(58) Field of Classification Search
None
See application file for complete search history.

(56) References Cited

U.S. PATENT DOCUMENTS

| | | | |
|---|---|---|---|
| 5,633,786 A * | 5/1997 | Matuszewski | H05K 9/0032 174/362 |
| 7,135,644 B1 | 11/2006 | Gilliland et al. | |
| 9,155,188 B2 * | 10/2015 | Merz | H05K 3/284 |
| 9,198,333 B2 * | 11/2015 | Adachi | H05K 9/002 |
| 10,021,817 B2 * | 7/2018 | Robinson | B21C 1/16 |
| 10,775,657 B2 * | 9/2020 | Inoue | G02F 1/133308 |
| 11,043,461 B2 * | 6/2021 | Kumura | H01L 23/433 |
| 11,047,628 B2 * | 6/2021 | Lee | H04M 1/026 |
| 11,178,799 B2 * | 11/2021 | Lee | H05K 9/0088 |
| 11,942,442 B2 * | 3/2024 | Hsu | H01L 23/3114 |
| 2010/0103068 A1 | 4/2010 | Chen et al. | |
| 2013/0015858 A1 | 1/2013 | Ferrand et al. | |

(Continued)

*Primary Examiner* — Anthony Q Edwards
*Assistant Examiner* — Rashen E Morrison
(74) *Attorney, Agent, or Firm* — Colby Nipper PLLC

(57) ABSTRACT

Techniques and apparatuses directed to component shielding are described in this document. A first aspect relates to a system including a printed circuit board (PCB) oriented along a first plane, a device on the PCB, and a component shield having a wall structure oriented perpendicular to the first plane and a cover structure connected to the wall structure. The system includes a housing structure oriented along a second plane that is substantially parallel to the first plane. The first and second planes define a shielded space within which the component shield and the device reside. The system further includes a shielding layer residing at least partially between the cover and housing structures. The shielding layer has an irregular cross-section along a fourth plane perpendicular to at least one of the first or second planes and a third plane. The irregular cross-section includes a protrusion that extends from the third plane.

14 Claims, 3 Drawing Sheets

(56) References Cited

U.S. PATENT DOCUMENTS

| | | | |
|---|---|---|---|
| 2014/0063774 A1* | 3/2014 | Samuels | H05K 9/0032 |
| | | | 361/818 |
| 2016/0028154 A1 | 1/2016 | Baek et al. | |
| 2017/0220074 A1* | 8/2017 | Cooper | H05K 9/0032 |
| 2019/0315098 A1 | 10/2019 | Healy | |
| 2020/0053919 A1* | 2/2020 | Lee | H05K 9/009 |
| 2020/0116435 A1* | 4/2020 | Lee | G06F 1/1626 |
| 2020/0127361 A1* | 4/2020 | Lee | H05K 9/0024 |
| 2023/0171932 A1* | 6/2023 | Yoon | H01Q 1/243 |
| | | | 361/679.01 |
| 2024/0114670 A1* | 4/2024 | Lin | H05K 9/0037 |
| 2024/0172356 A1* | 5/2024 | D Lingayat | H05K 1/023 |
| 2025/0133709 A1 | 4/2025 | Hsu et al. | |

\* cited by examiner

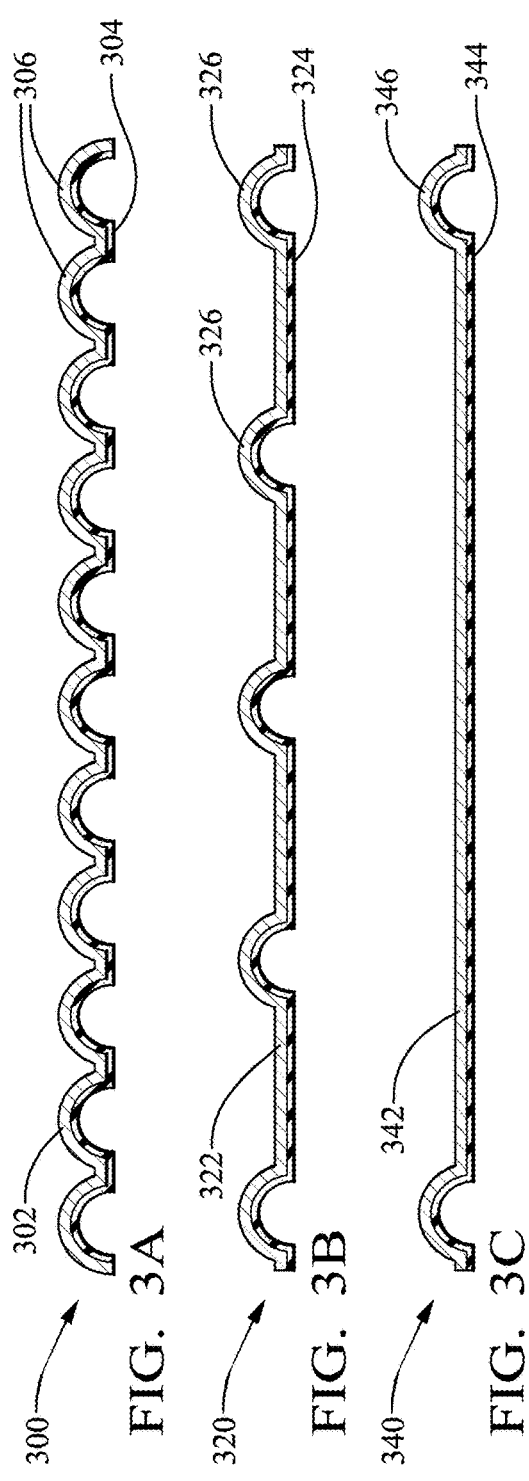
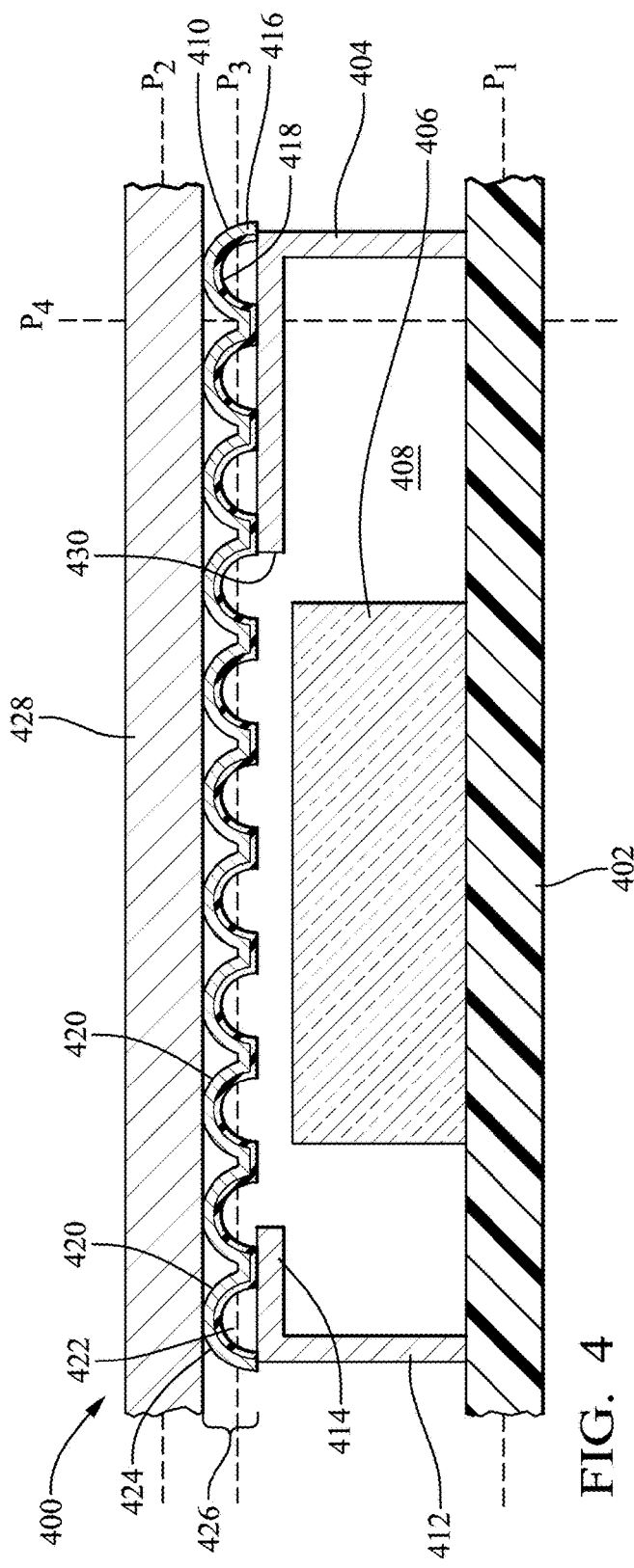

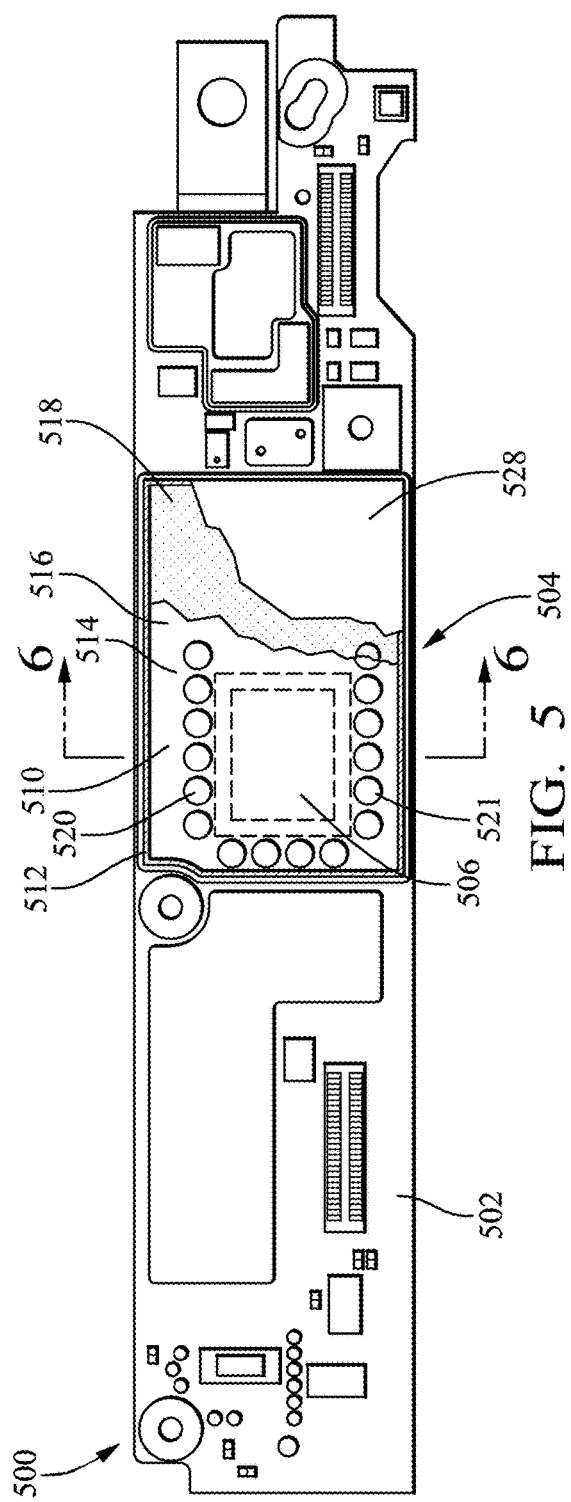
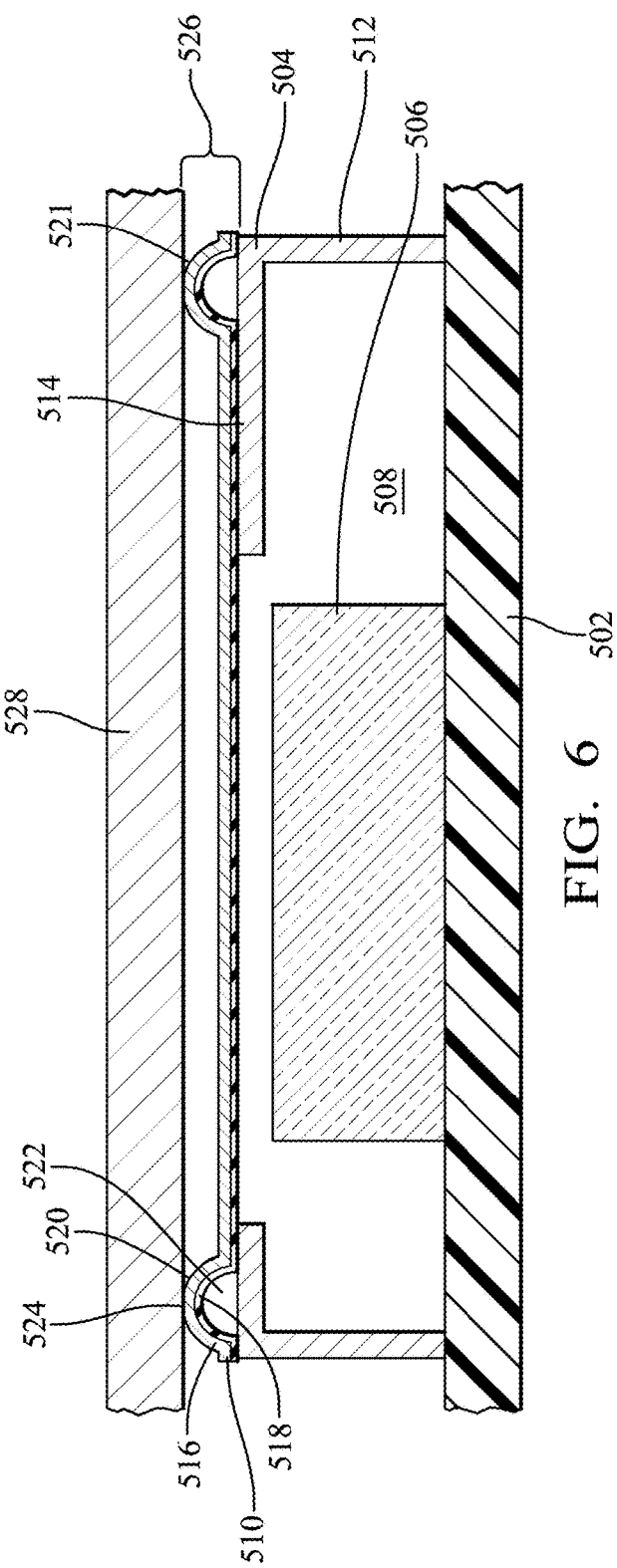
FIG. 5
FIG. 6

COMPONENT SHIELDING

SUMMARY

This document describes techniques and apparatuses directed to component shielding. In general, a first aspect of the present disclosure relates to a system that includes a printed circuit board oriented along a first plane. The printed circuit board has a device that extends in a direction away from the first plane and that is capable of producing a radiated signal and/or is sensitive to a radiated signal produced by another device. The system may further include a component shield that has a wall structure and a cover structure. The component shield is configured to attenuate the radiated signal. The wall structure is oriented perpendicular to the first plane. The cover structure is connected to the wall structure and is oriented parallel to the first plane.

The system may further include a housing structure that is oriented along a second plane that is substantially parallel to the first plane. The first and second planes define a shielded space within which the component shield and the device reside. The system may additionally include a shielding layer that resides at least partially between the cover structure and the housing structure. The shielding layer is configured to attenuate the radiated signal, is oriented along a third plane substantially parallel with the second plane, resides in the shielded space, and has an irregular cross-section along a fourth plane perpendicular to at least one of the first, second, or third planes. The irregular cross-section may be located in a region between the cover structure and the housing structure and may have a protrusion that extends from the third plane in which the shielding layer is oriented.

The details of one or more implementations are set forth in the accompanying Drawings and the following Detailed Description. Other features and advantages will be apparent from the Detailed Description, the Drawings, and the Claims. This Summary is provided to introduce subject matter that is further described in the Detailed Description. Accordingly, a reader should not consider the Summary to describe essential features nor the scope of the claimed subject matter.

BRIEF DESCRIPTION OF DRAWINGS

The details of one or more aspects of techniques and apparatuses directed to component shielding are described in this document with reference to the following Drawings, in which the use of same numbers in different instances may indicate similar features or components:

FIG. 3A is a side sectional view of another example of component shielding in accordance with this disclosure;

FIG. 3B is a side sectional view of a further example of component shielding in accordance with this disclosure;

FIG. 3C is a side sectional view of an additional example of component shielding in accordance with this disclosure;

FIG. 4 is a side sectional view of another example of a component shielding system in accordance with this disclosure;

FIG. 5 depicts an example environmental view of an additional example of a component shielding system in accordance with this disclosure; and FIG. 6 is a side sectional view of the component shielding system of FIG. 5.

DETAILED DESCRIPTION

Figure 1:
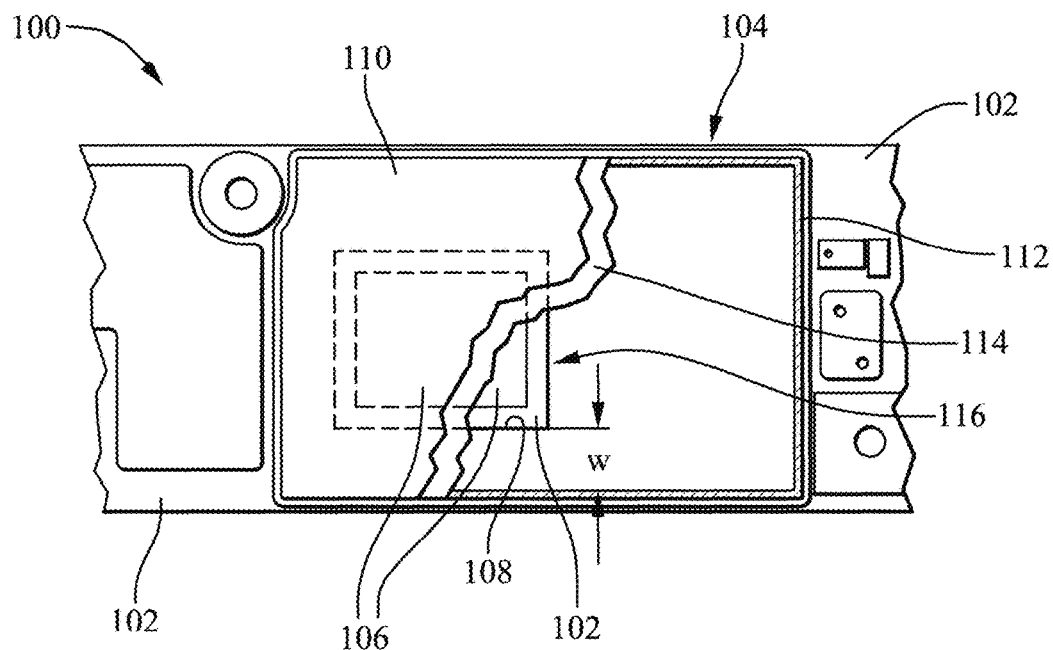
FIG. 1 illustrates a plan view of an example of a component shielding system in accordance with this disclosure.

A computing device (e.g., smartphone, tablet computer, mobile communication device) includes a number of internal components located within a housing. FIG. 1 illustrates a plan view of an example of a component shielding system 100 of a computing device in accordance with this disclosure. The computing device includes a substrate, such as a printed circuit board 102 (PCB 102) (e.g., main board, system board, motherboard) that includes a device 106 that extends in a direction away from the PCB 102 and/or the plane of the PCB (not illustrated). For example, in the plan view of FIG. 1, the device 106 extends outward in the direction towards the viewer. The device 106 may include an active component (e.g., integrated circuit chip, transceiver chip, system-on-chip (SoC), central processing unit (CPU), antenna) that radiates signals (e.g., electromagnetic waves, radio frequency (RF) radiation) that may cause electromagnetic interference (EMI). In aspects, the device 106 includes one or more active components (e.g., an antenna) or passive components that are sensitive to radiated signals. In aspects, the device 106 may be an SoC and the system 100 may include an antenna sensitive to radiated signals.

To mitigate EMI, a component shield (e.g., component shielding, component radiation shield) that forms an electromagnetic shield may be installed over the device. For example, a component shield 104 may be installed over the device 106 on the PCB 102 to mitigate EMI produced by the device 106 to prevent interference and/or shield the device 106 from the effects of EMI from sources external to the device 106. The component shield 104 may be surface mounted to the PCB 102 through a soldering process or may be otherwise positioned relative to the PCB 102.

The component shield 104 may include at least one wall structure 112 (e.g., sidewall) and at least one cover structure 114 (e.g., overhang structure). The cover structure 114 may include an aperture 108 defined therethrough. The aperture 108 may permit access to the device 106 after the component shield 104 is installed on the PCB 102 and/or may provide ventilation for the device 106. The aperture 108 through the cover structure 114 may be covered with a shielding layer 110 (e.g., adhesive metallic foil tape, adhesive shielding tape) to prevent RF radiation from passing through the aperture 108.

In the aspect illustrated in FIG. 1, the shielding layer 110 is planar and includes an adhesive portion (not illustrated). The shielding layer 110 is applied to the cover structure 114 to cover the aperture 108. When a component shield is installed on a PCB, a shielded space is defined. For example, in FIG. 1 the component shield 104 installed on the PCB 102 (with the shielding layer 110 covering the aperture 108) defines a shielded space 116 between the PCB 102, the component shield 104, and the shielding layer 110. The shielded space 116 surrounds at least a portion of the device 106.

In some aspects, the aperture 108 in the cover structure 114 of the component shield 104 is located in a position adjacent to the wall structure 112. In such a configuration, the width (w) of the cover structure 114 between the wall structure 112 and the aperture 108 may not provide a sufficient surface area to suitably bind with an adhesive of the shielding layer 110. In an example, the width (w) is less than three millimeters (3 mm). If the shielding layer 110 does not properly adhere along the width of the cover structure 114, the shielding layer 110 may deform (e.g., an edge of the shielding layer may peel, a fold may form in the shielding layer, a crease may form in the shielding layer). If the shielding layer 110 deforms, a gap in the protection offered by a component shield 104 may permit RF radiation to pass through the aperture 108 and into or out of the shielded space 116, potentially causing EMI. To avoid such gaps, a manufacturer may place one or more strips of a spacer material (e.g., a conductive foam, a conductive polyurethane (PU) foam, a fabric-over-foam (FoF) gasket, an EMI shielding gasket, a sponge, and the like)) between a housing structure of the computing device and the shielding layer to cause a compression of the shielding layer that prevents RF leakage. The housing structure may include one or more of a computing device housing, frame, midframe, mount, mounting structure, case, plate, front, sidewall, back, cover, or portion thereof.

Figure 2:
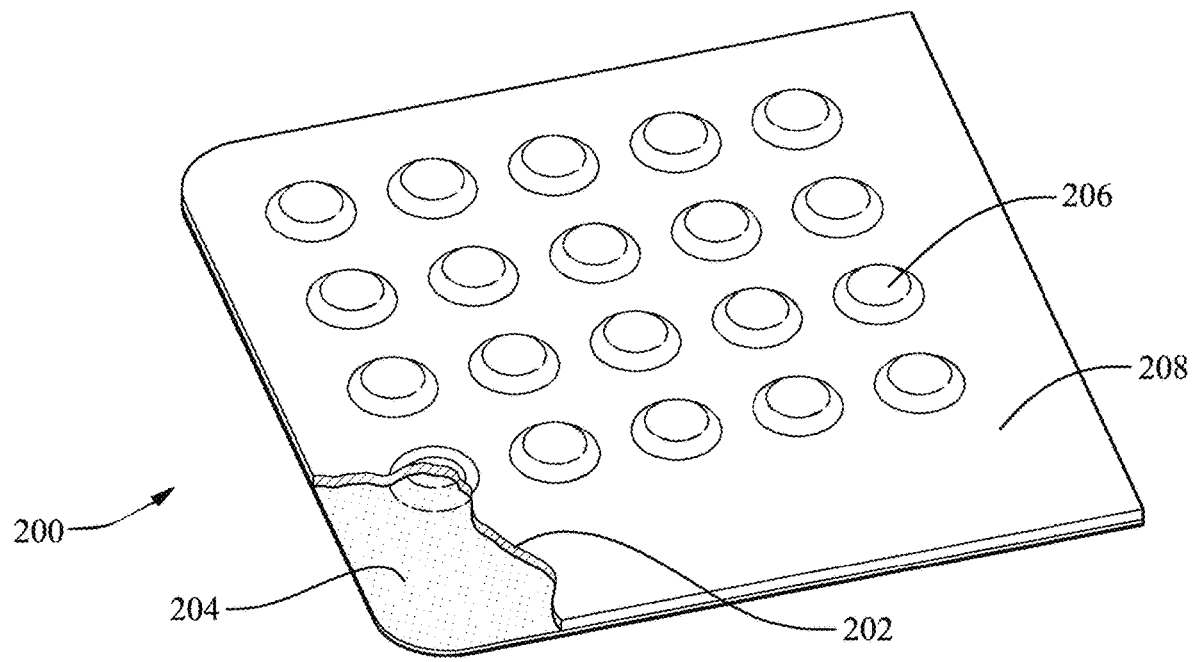
FIG. 2 illustrates a perspective view of an example of component shielding in accordance with this disclosure.

FIG. 2 illustrates a perspective view of an example of component shielding in accordance with this disclosure. In aspects, a shielding layer 200 may be implemented in the form of an adhesive shielding tape, a metallic foil tape, or the like. The component shielding includes the shielding layer 200. In aspects, the shielding layer 200 includes a foil portion 202 and an adhesive portion 204. The foil portion 202 and the adhesive portion 204 may have thicknesses relative to each other or may be of differing thicknesses. For example, the foil portion 202 may be thicker than the adhesive portion 204 (e.g., two times the thickness, four times the thickness).

The foil portion 202 may include a copper foil (e.g., copper layer, copper laminate, copper material, copper sheet). In aspects, the foil portion 202 is at least fifty percent (50%) elemental copper. The foil portion 202 is malleable and able to retain shapes formed in the foil portion 202. The foil portion 202 of the shielding layer 200 includes a face 208. In aspects, the face 208 is configured for contacting a surface, such as the surface of a housing structure, as is illustrated in the aspects of FIGS. 4 and 6.

The adhesive portion 204 is configured to adhere the foil portion 202 to a portion of a component shield, for example, the cover structure 114 of the component shield 104 of FIG. 1. The adhesive portion 204 may include one or more of an adhesive backer, a double-sided adhesive sheet, an adhesive, adhesive tape, a pressure-sensitive adhesive, fabric-over-foam (FoF), compressive conductive foam, or the like. In an example, the adhesive portion 204 includes a double-sided adhesive sheet and the foil portion 202 is applied to a first adhesive side of the adhesive portion 204 to form the shielding layer 200. In another example, the adhesive portion 204 is an adhesive that is sprayed or applied to a bottom side of the foil portion 202 to form the shielding layer 200. In a further example, the adhesive portion 204 is a pressure-sensitive adhesive (e.g., a conductive pressure-sensitive adhesive (cPSA)) and pressure applied to a face of the component shield causes the adhesive portion 204 to bond to the surface it is applied to (e.g., cover structure 114 of component shield 104). The adhesive portion 204 may be a conductive adhesive layer (e.g., pressure-sensitive adhesive (cPSA)), conductive adhesive tape) configured for conducting heat to the foil portion 202, and the shielding layer 200 may contact the device (e.g., device 106) to provide a thermal dissipation path to the chassis (e.g., the component shield 104) of the computing device.

The shielding layer 200 includes at least one protrusion 206 disposed on the face 208 of the foil portion 202. FIG. 2 illustrates an array of protrusions 206 disposed on the face 208. In this figure, the protrusions 206 are depicted as having a semi-spherical cross-sectional profile (e.g., a partial sphere, a semi-spherical shape, a button shape), but in aspects they may be of another cross-sectional shape, including, but not limited to frustoconical, frustopyramidal, rounded pyramidal, rounded triangular, rounded square, rounded polyhedral, and like shapes. The protrusions may protrude from a third plane and provide a mechanical resistance to a force between the housing structure and the cover structure. While the protrusions 206 illustrated in FIG. 2 have a circular plan shape, in aspects, a protrusion may have a different plan shape.

The protrusions 206 may have a measurement (e.g., diameter, width) that is greater than the height of the protrusions 206. For example, a protrusion may have a width of 2 mm and a height of 0.2 mm. The protrusions 206 may have a uniform size relative to each other or may have one or more different sizes relative to each other (e.g., first protrusions may have a first size and second protrusions may have a second size). One or more of the protrusions 206 may be positioned adjacent (e.g., 0.5 mm from) to an edge of the shielding layer 200. In aspects, the protrusions 206 may be positioned adjacent to one another and/or spread apart, as described below with respect to FIGS. 3A-3C. The protrusions 206 may be irregularly spaced or regularly spaced.

The protrusions 206 may be formed in the shielding layer 200 through pressing, stamping, folding, bending, or other means. In aspects, a plurality of the protrusions 206 are formed in the shielding layer 200 through the use of a material bending machine that presses through the adhesive portion 204 and into the foil portion 202 to form the protrusions 206. In aspects, the foil portion 202 and adhesive portion 204 may be compressed together before a material bending machine presses out the protrusions 206. In other aspects, the protrusions 206 may be pressed out before the foil portion 202 and the adhesive portion 204 are compressed together. In further aspects, the protrusions 206 may be formed in one or more of the foil portion 202 or the adhesive portion 204 before they are adhered together.

The face 208 of the protrusions 206 may be configured to contact a structure (e.g., housing structure 428 of FIG. 4) while the adhesive portion 204 of the shielding layer 200 adheres to another structure (e.g., cover structure 114). A contact force formed between the two structures allows for the region between them (e.g., region 426 of FIG. 4) to be sealed off. The ability of the protrusions 206 to be compressed by contact with a structure (e.g., housing structure 428 of FIG. 4) allows any gaps between that structure and another structure underneath to be filled and/or covered by the protrusions 206. For example, the protrusion 206 formed on the surface of the foil portion 202 enables the system to remove all gaps or openings that may leak a signal. The addition of the adhesive portion 204 described herein generally may be more effective in improving adhesion, provided there is a contact force between two mechanical components.

If the shielding layer 200 deforms when applied to a component shield (e.g., component shield 104 of FIG. 1) and a gap in the RF isolation protection afforded by the component shielding results, the protrusion 206 may act to seal the gap and prevent RF radiation from passing through the gap. The protrusion(s) 206 may create a mechanical force between the housing structure (e.g., housing structure 428 of FIG. 4) and the component shield (e.g., component shield 104), sealing a gap in the component shielding. For example, during the assembly of a computing device having a housing, a mechanical force between the shielding structure and the housing of the device may further compress the component shielding and seal any gaps in the RF shielding of the computing device, thereby providing for RF isolation for a device (component) on a circuit board of the computing device. In such a configuration, spacer material (e.g., conductive foam, conductive polyurethane (PU) foam, fabric-over-foam (FoF) gasket, EMI shielding gasket, and the like) inserted between the housing structure (e.g., midframe) of the computing device and the component shielding may not be necessary to eliminate gaps.

FIGS. 3A-3C are cross-sectional illustrations of three examples of component shielding layers (e.g., shielding layer 200 of FIG. 2) in accordance with this disclosure. FIG. 3A illustrates a shielding layer 300 that includes a foil portion 302, an adhesive portion 304, and a plurality of protrusions 306. The protrusions 306 are close in proximity with one another, almost overlapping, along the entirety of the length of the shielding layer 300. FIG. 3B illustrates a shielding layer 320 that includes a foil portion 322, an adhesive portion 324, and a plurality of protrusions 326. The protrusions 326 are illustrated as widely spaced with significant gaps between them. FIG. 3C illustrates a shielding layer 340 that includes a foil portion 342, an adhesive portion 344, and two widely spaced protrusions 346 with a wide gap between them. Again, these are merely examples. In implementations, the protrusions may be numbered differently, spaced differently, regularly spaced, or irregularly spaced.

FIG. 4 is a side sectional view of a component shielding system 400 of a computing device. The component shielding system 400 is similar to the component shielding system 100 illustrated in FIG. 1 and described above, except as detailed below. Thus, the component shielding system 400 includes a PCB 402, a component shield 404, a device 406, a shielding layer 410, a wall structure 412, a cover structure 414, and an aperture 430. The shielding layer 410 is similar to the shielding layers (200, 300, 320, 340) respectively illustrated in FIGS. 2, 3A, 3B, and 3C and described above, except as detailed below. Thus, the shielding layer 410 includes a foil portion 416, an adhesive portion 418, at least one protrusion 420, and a face 424.

In FIG. 4, the printed circuit board 402 is oriented along a first plane $P_1$, and the device 406 extends in a direction away from the first plane $P_1$. The wall structure 412 is oriented perpendicular to the first plane $P_1$, and the cover structure 414, which is connected to the wall structure 412, oriented parallel to the first plane $P_1$. A housing structure 428 is oriented along a second plane $P_2$. The second plane $P_2$ is substantially parallel to the first plane $P_1$. The first and second planes define a shielded space 408 within which the component shield 404 and the device 406 reside. In aspects, the shielded space 408 is defined between the PCB 402, the interior walls of the wall structure 412 and the cover structure 414, and a portion of the shielding layer 410.

The shielding layer 410 is positioned at least partially between the cover structure 414 and the housing structure 428. The shielding layer 410 is configured to attenuate a radiated signal. The shielding layer 410 is oriented along a third plane $P_3$ substantially parallel with the second plane $P_2$. The shielding layer 410 resides in the defined shielded space 408.

The shielding layer 410 has an irregular cross-section along a fourth plane $P_4$ perpendicular to at least one of the first, second, or third planes. The irregular cross-section is at least in a region 426 between the cover structure 414 and the housing structure 428. The irregular cross-section has the protrusion 420 from the third plane $P_3$ in which the shielding layer 410 is oriented. In aspects, the protrusion 420 extends from the third plane $P_3$. The protrusion 420 provides a mechanical resistance to a force between the housing structure 428 and the cover structure 414. The protrusion 420 may be solid relative to the face 424 (e.g., outer surface) of the protrusion 420 and the third plane $P_3$.

In aspects, when the shielding layer 410 is applied to a surface (e.g., the cover structure 414), a void (e.g., void 422 illustrated in FIG. 4) may be defined between the shielding layer 410 and the surface (e.g., the cover structure 414). Through the sealing of the adhesive portion 418 against the cover structure 414 of the component shield 404, the void 422 may include a sealed gas (e.g., atmospheric air). The pressure of the sealed gas may support the protrusion 420 and resist deformation thereof, further preventing a gap in the protection offered by the component shield 404 that permits RF radiation to pass through the aperture 430 (e.g., aperture 108) and into or out of the shielded space 408. In aspects, the protrusion 420 includes a void 422 relative to a face 424 (e.g., outer surface) of the protrusion 420 and the third plane $P_3$.

FIG. 5 depicts an example environmental view of an additional example of a component shielding system 500 and FIG. 6 is a side sectional view of the component shielding system 500 of FIG. 5. The component shielding system 500 is similar to the component shielding system 400 illustrated in FIG. 4 and described above, except as detailed below. Thus, the component shielding system 500 includes a PCB 502, a component shield 504, a device 506, a shielding layer 510, a wall structure 512, a cover structure 514, and a housing structure 528. The device 506 may extend in a direction away from a first plane $P_1$ (see FIG. 4). The shielding layer 510 is similar to the shielding layers (200, 300, 320, 340, 410) respectively illustrated in FIGS. 2, 3A, 3B, 3C, and 4 and described above, except as detailed below. Thus, the shielding layer 510 includes a foil portion 516, an adhesive portion 518, a protrusion 520, and at least a second protrusion 521.

FIG. 6 is a side sectional view of the component shielding system 500 of FIG. 5. The side sectional view includes a face 524 and a region 526. The face 524 of the shielding layer 510 may contact the housing structure 528. The shielding layer 510 resides in the region 526 between the cover structure 514 and the housing structure 528. The side sectional view depicts the protrusion 520 and the second protrusion 521 of the shielding layer 510. The protrusion 520 and the second protrusion 521 may contact the housing structure 528, forming a mechanical contact force between the housing structure 528 and the cover structure 514. The contact force between those two components ensures the sealing of the component shielding system 500 within the region 526.

A void 522 may be defined between the adhesive portion 518 of the protrusion 520 and the cover structure 514 of the component shield 504. The void 522 is similar to the void 422 of FIG. 4.

The disclosed techniques and apparatuses directed to component shielding allow for improved adhesion to a cover structure of a component shield of a device, such as a smartphone. Improved adhesion can prevent radiated signals from leaking out from or into a shielded space of a component shield. Additionally, a protrusion or a plurality of protrusions and an adhesive portion included in a shielding layer will ensure the adhesion onto the cover structure, thus allowing for a permanent enclosure of radiated signals from the device and/or isolation of the device from radiated signals.

The preceding discussion describes techniques and apparatuses directed to component shielding. Although techniques and apparatuses directed to component shielding are described, it is to be understood that the subject of the appended Claims is not necessarily limited to the specific features or methods described. Rather, the specific features and methods are disclosed as example implementations, and reference is made to the operating environment by way of example only.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, c-c-c, or any other ordering of a, b, and c).

Although implementations of techniques and apparatuses directed to a component shielding have been described in language specific to certain features and/or methods, the subject of the appended Claims is not necessarily limited to the specific features or methods described. Rather, the specific features and methods are disclosed as example implementations of component shielding.

What is claimed is:

1. A system comprising:
   a printed circuit board oriented along a first plane, the printed circuit board having a device that extends in a direction away from the first plane and is at least one of capable of producing a radiated signal or is sensitive to a radiated signal produced by another device;
   a component shield having a wall structure and a cover structure, the wall structure oriented perpendicular to the first plane, and the cover structure connected to the wall structure and oriented parallel to the first plane;
   a housing structure oriented along a second plane, the second plane being substantially parallel to the first plane and the first and second planes defining a shielded space within which the component shield and the device reside; and
   a shielding layer, the shielding layer:
      disposed in contact with the cover structure of the component shield and with the housing structure;
      configured to attenuate radiated signals;
      oriented along a third plane substantially parallel with the second plane;
      residing in the shielded space; and
      having an irregular cross-section along a fourth plane perpendicular to at least one of the first, second, or third planes, the irregular cross-section being at least in a region between the cover structure of the component shield and the housing structure and having a protrusion from the third plane in which the shielding layer is oriented.

2. The system of claim 1, wherein the protrusion is a partial sphere protruding from the third plane and providing a mechanical resistance to a force between the housing structure and the cover structure.

3. The system of claim 1, wherein the protrusion is a button protruding from the third plane and providing a mechanical resistance to a force between the housing structure and the cover structure.

4. The system of claim 1, wherein the protrusion is a semi-spherical shape protruding from the third plane and providing a mechanical resistance to a force between the housing structure and the cover structure.

5. The system of claim 1, wherein the protrusion includes a void relative to an outer surface of the protrusion and the third plane.

6. The system of claim 1, wherein the protrusion is solid relative to an outer surface of the protrusion and the third plane.

7. The system of claim 1, wherein the system is within a mobile communication device.

8. The system of claim 1, further comprising an antenna and wherein the device is a system-on-chip (SoC) and the antenna is sensitive to radiated signals.

9. The system of claim 1, wherein the housing structure is a midframe of a mobile communication device.

10. The system of claim 1, wherein the shielding layer comprises a foil portion and an adhesive portion configured to adhere the foil portion to a portion of the component shield.

11. The system of claim 10, wherein the foil portion is 50% or more elemental copper.

12. The system of claim 1, wherein the shielding layer covers all gaps over an aperture defined in the component shield.

13. The system of claim 1, wherein the protrusion of the shielding layer comprises a plurality of protrusions.

14. A system comprising:
   a printed circuit board oriented along a first plane, the printed circuit board having a device that extends in a direction away from the first plane and is at least one of capable of producing a radiated signal or is sensitive to a radiated signal produced by another device;
   a component shield having a wall structure and a cover structure, the wall structure oriented perpendicular to the first plane, and the cover structure connected to the wall structure and oriented parallel to the first plane;
   a housing structure oriented along a second plane, the second plane being substantially parallel to the first plane and the first and second planes defining a shielded space within which the component shield and the device reside; and
   a shielding layer, the shielding layer:
      disposed in contact with the cover structure of the component shield and with the housing structure;
      configured to attenuate radiated signals;
      oriented along a third plane substantially parallel with the second plane;
      residing in the shielded space; and
      having an irregular cross-section along a fourth plane perpendicular to at least one of the first, second, or third planes, the irregular cross-section being at least in a region between the cover structure of the component shield and the housing structure and having a protrusion from the third plane in which the shielding layer is oriented, the protrusion compressed by contact with the housing structure.

* * * * *